United States Patent
Stolczenberger et al.

(10) Patent No.: US 10,288,695 B2
(45) Date of Patent: May 14, 2019

(54) METHOD FOR ASCERTAINING AN INTERNAL RESISTANCE OF AN ELECTRICAL ENERGY ACCUMULATOR

(71) Applicant: Robert Bosch GmbH, Stuttgart (DE)

(72) Inventors: Robert Stolczenberger, Mor (HU); Ferenc Varadi, Gyomro (HU); Gabor Barany, Budapest (HU)

(73) Assignee: Robert Bosch GmbH, Stuttgart (DE)

( * ) Notice: Subject to any disclaimer, the term of this patent is extended or adjusted under 35 U.S.C. 154(b) by 174 days.

(21) Appl. No.: 15/506,541

(22) PCT Filed: Jul. 6, 2015

(86) PCT No.: PCT/EP2015/065336
§ 371 (c)(1),
(2) Date: Feb. 24, 2017

(87) PCT Pub. No.: WO2016/030065
PCT Pub. Date: Mar. 3, 2016

(65) Prior Publication Data
US 2017/0254860 A1    Sep. 7, 2017

(30) Foreign Application Priority Data
Aug. 27, 2014 (DE) .................. 10 2014 217 087

(51) Int. Cl.
*H01M 10/48* (2006.01)
*G01R 31/36* (2019.01)
(Continued)

(52) U.S. Cl.
CPC ....... *G01R 31/389* (2019.01); *G01R 31/3648* (2013.01); *G01R 31/3842* (2019.01); *H01M 10/48* (2013.01)

(58) Field of Classification Search
CPC ........... G01R 31/3624; G01R 31/3648; G01R 31/3662
See application file for complete search history.

(56) References Cited

U.S. PATENT DOCUMENTS 6,172,483 B1 * 1/2001 Champlin .......... G01R 31/3662
                                                320/134
6,252,406 B1 * 6/2001 Tegge ..................... G06F 1/26
                                                320/136
(Continued)

FOREIGN PATENT DOCUMENTS

DE      10205120 A1      7/2003
DE      10345057 A1      4/2005
(Continued)

OTHER PUBLICATIONS

International Search Report for PCT/EP2015/065336, dated Sep. 22, 2015.

*Primary Examiner* — Michael J Dalbo
(74) *Attorney, Agent, or Firm* — Norton Rose Fulbright US LLP; Gerard Messina

(57) ABSTRACT

A method is described for ascertaining an internal resistance of an electrical energy accumulator. For this purpose, an analog voltage signal and an analog current signal are subjected to an analog to digital conversion and subsequently to band-pass filtering in order to obtain filtered voltage values and filtered current values. These are then checked with regard to different calculation prerequisites, whereupon a zero-phase resistance is calculated. Then, the calculated zero-phase resistance is supplied as internal resistance.

7 Claims, 4 Drawing Sheets

(51) Int. Cl.
    *G01R 31/389*  (2019.01)
    *G01R 31/3842* (2019.01)

(56) References Cited

U.S. PATENT DOCUMENTS

| | | | | |
|---|---|---|---|---|
| 2006/0022676 A1* | 2/2006 | Uesaka | ............... | G01R 31/361 324/429 |
| 2012/0004875 A1* | 1/2012 | Maeda | ................ | H01M 10/48 702/63 |
| 2012/0242344 A1* | 9/2012 | Ishishita | .............. | B60L 3/0046 324/430 |
| 2012/0303301 A1 | 11/2012 | Park | | |
| 2014/0125135 A1* | 5/2014 | Walker | ................ | H03F 1/0222 307/77 |
| 2016/0124038 A1* | 5/2016 | Matsushita | .......... | G01R 31/025 324/510 |

FOREIGN PATENT DOCUMENTS

| | | |
|---|---|---|
| DE | 102010043388 A1 | 12/2011 |
| DE | 102011003690 A1 | 8/2012 |
| EP | 1522866 A2 | 4/2005 |
| JP | S58151556 A | 9/1983 |
| JP | S63108284 A | 5/1988 |
| JP | H0630528 A | 2/1994 |
| JP | H07128418 A | 5/1995 |
| JP | 2002530987 A | 9/2002 |
| JP | 2007024740 A | 2/2007 |
| JP | 2011137681 A | 7/2011 |
| JP | 2012042429 A | 3/2012 |
| WO | 2006037694 A1 | 4/2006 |
| WO | 2012118005 A1 | 9/2012 |

* cited by examiner

METHOD FOR ASCERTAINING AN INTERNAL RESISTANCE OF AN ELECTRICAL ENERGY ACCUMULATOR

BACKGROUND INFORMATION

The internal resistance of an energy accumulator can be determined in different ways. In the automotive field, it is common to calculate the differential resistance, the zero-phase resistance or the Ohmic resistance and to determine the internal resistance therefrom. One method for ascertaining the differential resistance is described in the laid-open document WO 2006037694 A1.

SUMMARY

The present invention relates to a method for ascertaining an internal resistance of an electrical energy accumulator. According to the present invention, the internal resistance is determined by calculating a zero-phase resistance, which in turn is supplied as internal resistance to be ascertained. In so doing, the following method steps are carried out in sequential order:
  a. Analog to digital conversion of an analog voltage signal and an analog current signal of the electrical energy accumulator in order to obtain digital voltage values and digital current values,
  b. Filtering of the digital voltage values and the digital current values with the aid of a band-pass filter around the zero-phase frequency in order to obtain filtered voltage values and current values,
  c. Checking whether the following calculation prerequisites have been satisfied:
    I. The band-pass filter is initialized,
    II. A peak current value together with its associated instant is ascertained from the filtered current values,
    III. The amount of the peak current value is greater than the amount of a threshold current value, the amount of the threshold current value being greater than the amount of a minimum threshold current value by which a zero-phase resistance with a predefined maximum deviation from the actual internal resistance is able to be calculated,
    IV. The filtered voltage value at the previously ascertained instant is a peak voltage value, V. The peak current value and the peak voltage value have the same algebraic sign, these calculation prerequisites being checked one after the other; however, calculation prerequisite I may also be checked at any other arbitrary point in method step c, and the method is ended if one of the calculation prerequisites is not satisfied,
  d. Calculating the zero-phase resistance from the peak voltage value and the peak current value if the method was not yet ended previously,
  e. Providing the zero-phase resistance as the internal resistance of the electrical energy accumulator to be ascertained if the method was not yet ended previously.

This offers the advantage that even small current or voltage fluctuations are sufficient to induce the electrical energy accumulator to calculate the zero-phase resistance, and thus to ascertain the internal resistance of the electrical energy accumulator, as is the case while driving or when the engine is switched off, for example. A strong excitation of the electrical energy accumulator owing to an engine start is therefore no longer a prerequisite for the ability to ascertain the internal resistance. This is advantageous especially in the case of hybrid and electric vehicles for which there exists no classic engine start. In addition, the method requires only little computational work in comparison with other methods for ascertaining the internal resistance, such as a method by means of a spectral method, in which the internal resistance is determined by a discrete Fourier transformation. The method is furthermore optimized for use in an embedded system, e.g., in an electrical battery sensor, and may be used both for an active and for a passive determination of the internal resistance. An active determination refers to the excitation of the electrical energy accumulator with the aid of a controlled alternating voltage at specific frequencies. The main advantage is that the internal resistance is able to be calculated without interruption and independently of the mains voltage. However, the active ascertaining requires complex hardware with power electronics and furthermore loads the battery. On the other hand, a passive ascertainment refers to the excitation of the electrical energy accumulator by a mains voltage of a three-phase generator or by a consumer. This reduces the hardware demands since only a measurement of the current and voltage of the energy accumulator is required. This may be realized with the aid a shunt or a Hall-effect sensor, for example. However, since the excitation of the energy accumulator is not directly controlled in this passive ascertainment, the internal resistance is not updated in the event that the calculation prerequisites are not satisfied. Furthermore, by varying the threshold current value, the precision of the determination of the internal resistance is able to be adjusted.

One advantageous further refinement of the method of the present invention provides that a further method step f is carried out between method step a and method step e, in which the validity of the digital voltage values and the digital current values is checked. Here, the digital voltage values and digital current values are considered valid if method step a has been carried out successfully. In the case of an invalid digital voltage value or digital current value, on the other hand, the method is ended. This has the advantage that the method is continued only on the basis of valid measured values, or in other words, fault-free measured values. In case of faulty measured values, this not only makes it possible to reduce the calculation work but also avoids the supply of an incorrect zero-phase resistance as internal resistance.

Another advantageous further refinement of the present method provides that the peak current value or also the peak voltage value are ascertained with the aid of an especially three-element first in-first out principle (FIFO), in particular. This is advantageous insofar as the FIFO principle constitutes an uncomplicated means for ascertaining a peak value from a plurality of values. The computational power required for this method step is thereby kept to a minimum.

In one advantageous further refinement of the method of the present invention, it is provided that a further method step g is carried out between method step d and method step e, in which the plausibility of the zero-phase resistance is checked. In this context, the zero-phase resistance is considered plausible if it lies between a theoretical minimum limit value and a theoretical maximum limit value of the internal resistance to be expected. If this is not the case, the method will be ended. This is advantageous insofar as the calculated zero-phase resistance is provided as internal resistance in method step e only if it is considered plausible. This avoids the supply of an incorrect zero-phase resistance as internal resistance.

In another advantageous further development of the method of the present invention, it is provided that the calculation of the zero-phase resistance in method step d takes place by calculating a quotient from the peak voltage value and the peak current value. This is advantageous because it constitutes a simple possibility for calculating the zero-phase resistance and thus requires only a low computational capacity.

One advantageous specific embodiment of the present invention provides that a further method step h takes place between method step h and method step e, in which the calculated zero-phase resistance is low-pass filtered, in particular by means of a PT1 element. This is advantageous insofar as the filtering makes it possible to reduce the standard deviation that arises as a result of measuring noise, for instance.

Another advantageous further development of the method according to the present invention provides that the calculation of the zero-phase resistance in method step d is carried out by calculating a quotient of the root mean square of the peak voltage values to the root mean square of the peak current values. This is advantageous insofar as this calculation method makes it possible to increase the accuracy of the calculation of the zero-phase resistance even further.

DETAILED DESCRIPTION

Figure 1:
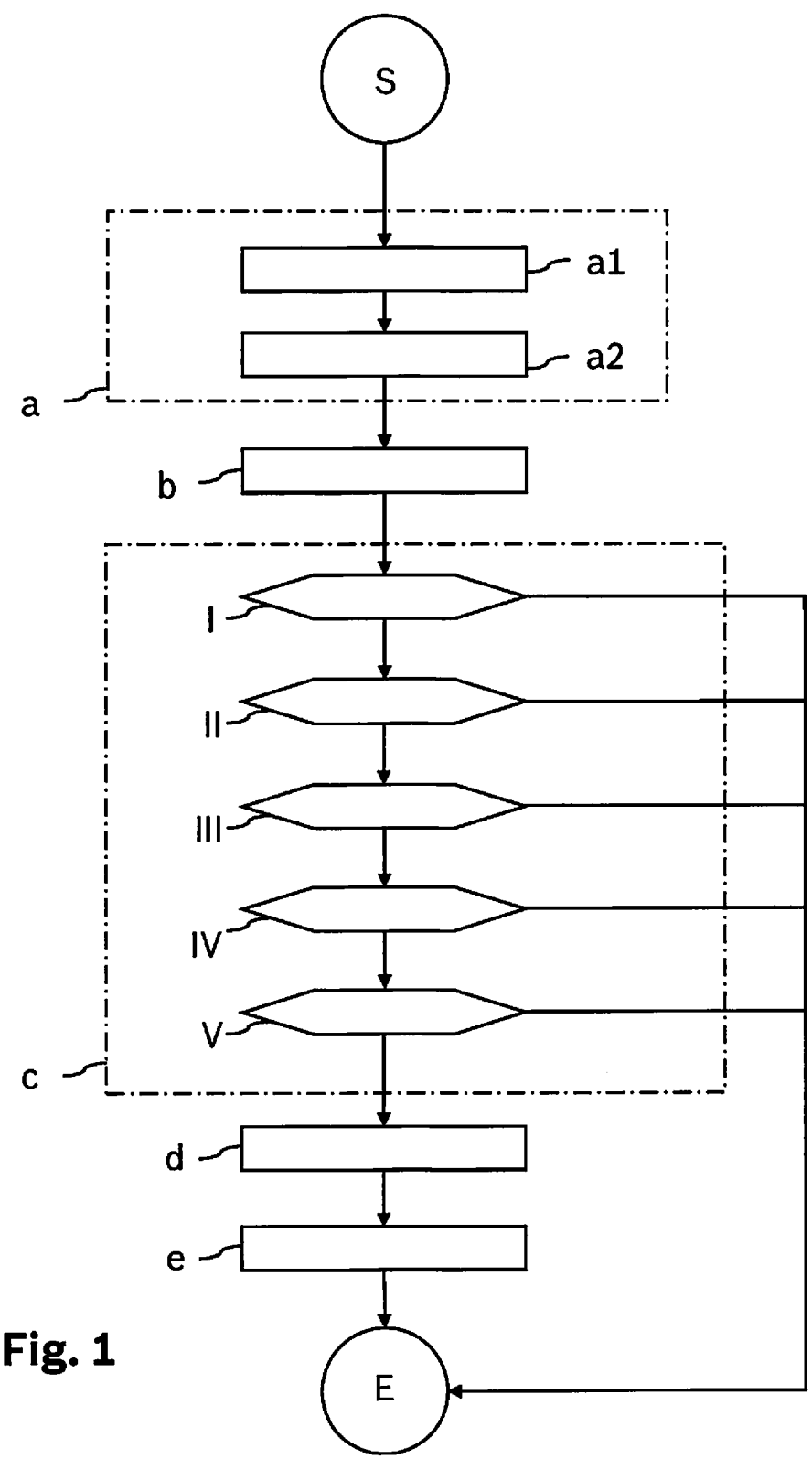
FIG. 1 shows a first exemplary embodiment of a method for ascertaining the internal resistance of an electrical energy accumulator according to the present invention.

FIG. 1 shows a first exemplary embodiment of a method for ascertaining the internal resistance of an electrical energy accumulator according to the present invention. The method starts in start S. To begin with, an analog voltage signal $U_{analog}$ and an analog current signal $I_{analog}$ of the electrical energy accumulator are converted into digital voltage values U and digital current values I in a method step a. This analog to digital conversion takes place in method step a by a first partial step a1 and a second partial step a2. In first partial step a1, analog voltage signal $U_{analog}$ and analog current signal $I_{analog}$ are low-pass filtered, which is done with the aid of an analog low-pass filter, for example. In a second partial step a2, low-pass filtered analog voltage signal $U_{analog}$ and low-pass filtered analog current signal $I_{analog}$ are then sampled in order to obtain digital voltage values U and digital current values I. The sampling for analog voltage signal $U_{analog}$ and analog current signal $I_{analog}$ takes place concurrently and under the precondition that a sampling frequency $f_{Tast}$ is at least twice as large as a maximum zero-phase frequency $f_{zp,max}$. The low-pass filtering serves to ensure that the bandwidth of the signal to be sampled is adequate for the sampling rate. Furthermore, the Nyquist-Shannon sampling theorem is observed by the prerequisite for sampling frequency $f_{Tast}$. Digital voltage values U and digital current values I are filtered in a subsequent method step b. The filtering is carried out with the aid of a band-pass filter which filters around a zero-phase frequency $f_{zp}$. The impedance angle is approximately zero at this zero-phase frequency $f_{zp}$. Zero-phase frequency $f_{zp}$, for example, is a function of the type of energy accumulator, the temperature, and the charge state. In the case of lead batteries the zero-phase frequency $f_{zp}$ typically lies between 300 Hz and 1 kHz. The band-pass filtering yields filtered voltage values $U_{filt}$ and filtered current values $I_{filt}$. In a further method step c, a plurality of calculation prerequisites are subsequently checked one after the other. As soon as even one of these calculation prerequisites is not satisfied, the method is ended prematurely. The ending is shown as end E here. After the ending, the method typically starts again in start S. On the basis of calculation prerequisite I it is checked whether the band-pass filter is initialized. For example, in the case of a band-pass filter of the $n^{th}$ order, the band-pass filter is initialized only after n sampled values, n representing a natural number greater than zero in this instance. Calculation prerequisite II is used to check whether a peak current value $I_p$ is able to be ascertained from filtered current values $I_{filt}$. Peak current value $I_p$, for example, is determined with the aid of a FIFO principle, in particular a three-element FIFO principle. In so doing, the most recently sampled and subsequently filtered current values $I_{filt}$ are compared to one another. If it is possible to determine one of the filtered current values $I_{filt}$ as peak current value $I_p$, then the temporal occurrence of peak current value $I_p$ is defined as instant $t_p$. On the other hand, if no peak current value $I_p$ is ascertained, then at least one oldest filtered current value $I_{filt}$ is replaced with at least one new filtered current value $I_{filt}$ during the next method cycle and an attempt is made to ascertain a peak current value $I_p$ from the existing and new values. As third calculation prerequisite III it is checked whether the amount of current peak value $I_p$ is greater than the amount of a threshold current value $I_{th}$. Threshold current value $I_{th}$ is able to be varied from method cycle to method cycle provided its amount is always greater than the amount of a minimum threshold current value $I_{th,min}$, by which a zero-phase resistance $R_{zp}$ is still able to be calculated with a predefined maximum deviation from actual internal resistance $R_i$ of the electrical energy accumulator. For example, the maximum deviation between internal resistance $R_i$ ascertained with the aid of a battery sensor, and an actual, current value of internal resistance $R_1$ should not be greater than 10%. By varying threshold current value $I_{th}$, the accuracy of the calculation of zero-phase resistance $R_{zp}$ is able to be adapted at the expense of the frequency of its calculation. In this context it holds that the higher threshold current $I_{th}$, the more precise the calculated zero-phase resistance $R_{zp}$, and thus also the provided internal resistance $R_i$, but the rarer the zero-phase resistance calculation as such. Then, it is checked with the aid of calculation prerequisite IV whether filtered voltage value $U_{filt}$ is a peak voltage value $U_p$ at instant $t_p$. For example, this is once again implemented with the aid of a FIFO principle. Thereafter, it is then checked based on calculation prerequisite V whether peak current value $I_p$ and peak voltage value $U_p$ have the same algebraic sign. Because of the calculation prerequisites and the band-pass filtering, it is achieved that both peak current value $I_p$ and peak voltage value $U_p$ are essentially made up of a real component and thus have no imaginary component or only a very slight one. This means that the phase angle of the sampled analog current signal and the voltage signal amounts either to approximately 0° or to approximately 180°. In a subsequent method step d, zero-phase resistance $R_{zp}$ is therefore able to be calculated as a measure of internal resistance $R_i$. The calculation of zero-phase resistance $R_{zp}$ is carried out by dividing peak voltage value $U_p$ by peak current value $I_p$. In a method step e, calculated zero-phase resistance $R_{zp}$ is then provided as internal resistance $R_i$ to be ascertained and the method then is ended. As already mentioned, the method is typically restarted again following end E. This continues until internal resistance $R_i$ is no longer meant to be determined. In a normal case, moreover, a plurality of these methods are running at a time offset. For example, analog voltage signal $U_{analog}$ and analog current signal $I_{analog}$ are sampled over a certain period of time and in the further course of the method, an attempt is made to ascertain internal resistance $R_i$ of the energy accumulator therefrom in that the values are processed further as indicated. However, the method is already restarted again during this further processing in order to continue with the sampling of analog voltage signal $U_{analog}$ and analog current signal $I_{analog}$ and to determine internal resistance $R_i$ therefrom again.

Figure 2:
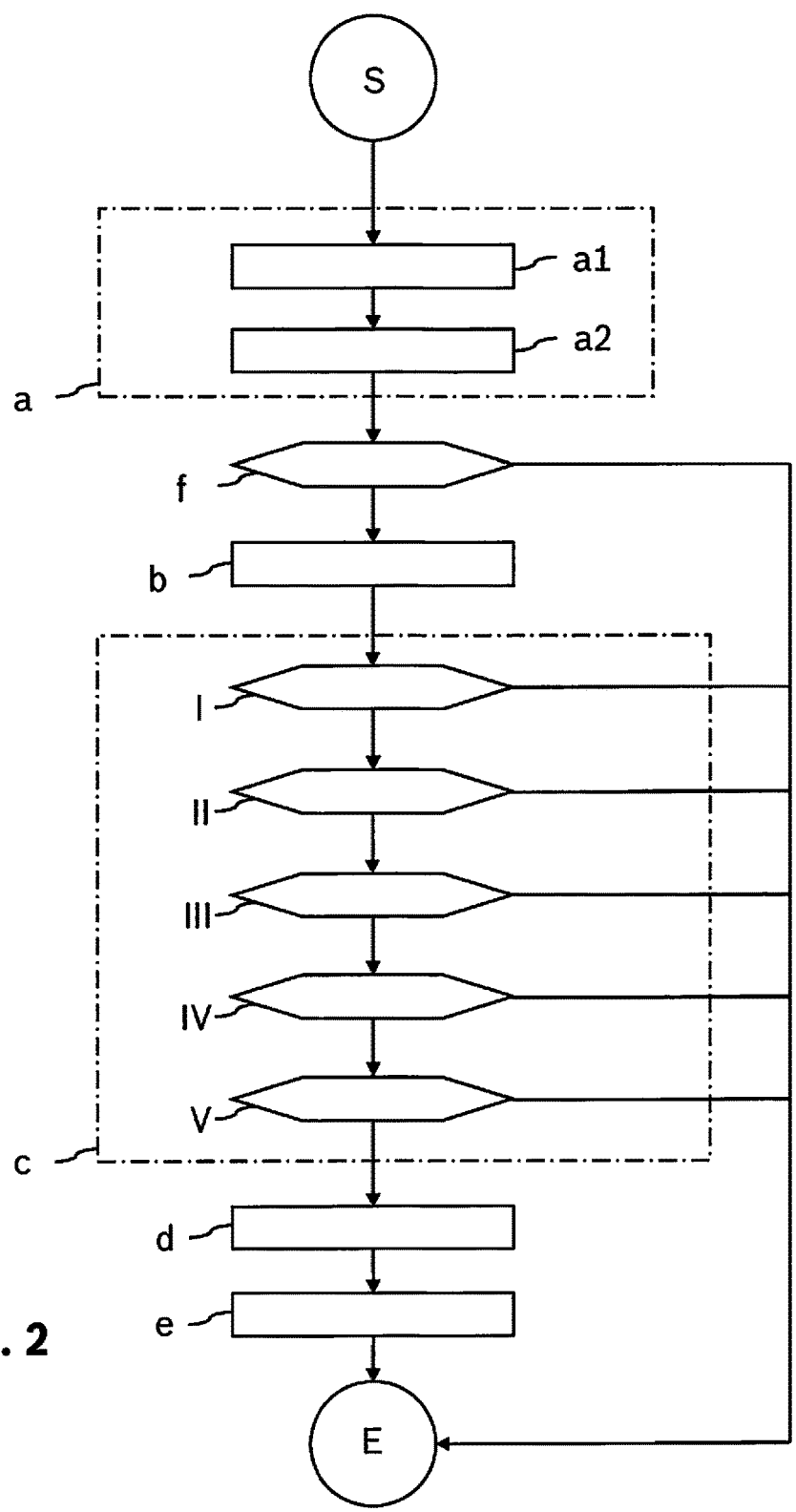
FIG. 2 shows a second exemplary embodiment of a method for ascertaining the internal resistance of an electrical energy accumulator according to the present invention.

FIG. 2 shows a second exemplary embodiment of a method for ascertaining the internal resistance of an electrical energy accumulator according to the present invention. The method is executed in an identical manner to the method according to FIG. 1. However, an optional method step f takes place between method step a and method step b, in which it is checked whether the analog to digital conversion in method step a has been carried out successfully. If this is not the case, digital voltage values U and/or digital current values I are considered invalid and the method is ended. Possible reasons for a faulty analog to digital conversion, for example, are occurring interference signals or a reconfiguration of the analog to digital converter. For instance, the plausibility check is able to be implemented by giving digital voltage values U and digital current values I an additional, binary status flag during the analog to digital conversion, which indicates whether the analog to digital conversion was successful. In method step f, all that remains to be checked is whether or not the status flag of the respective value is set.

In one alternative exemplary embodiment, which is not illustrated, method step f is executed following method step b, but at least prior to method step e. In a further exemplary embodiment (not shown), the analog to digital converter and the low-pass filter are reinitialized when the method is ended on account of an invalid digital current value I or also an invalid digital voltage value U, prior to starting the method the next time.

Figure 3:
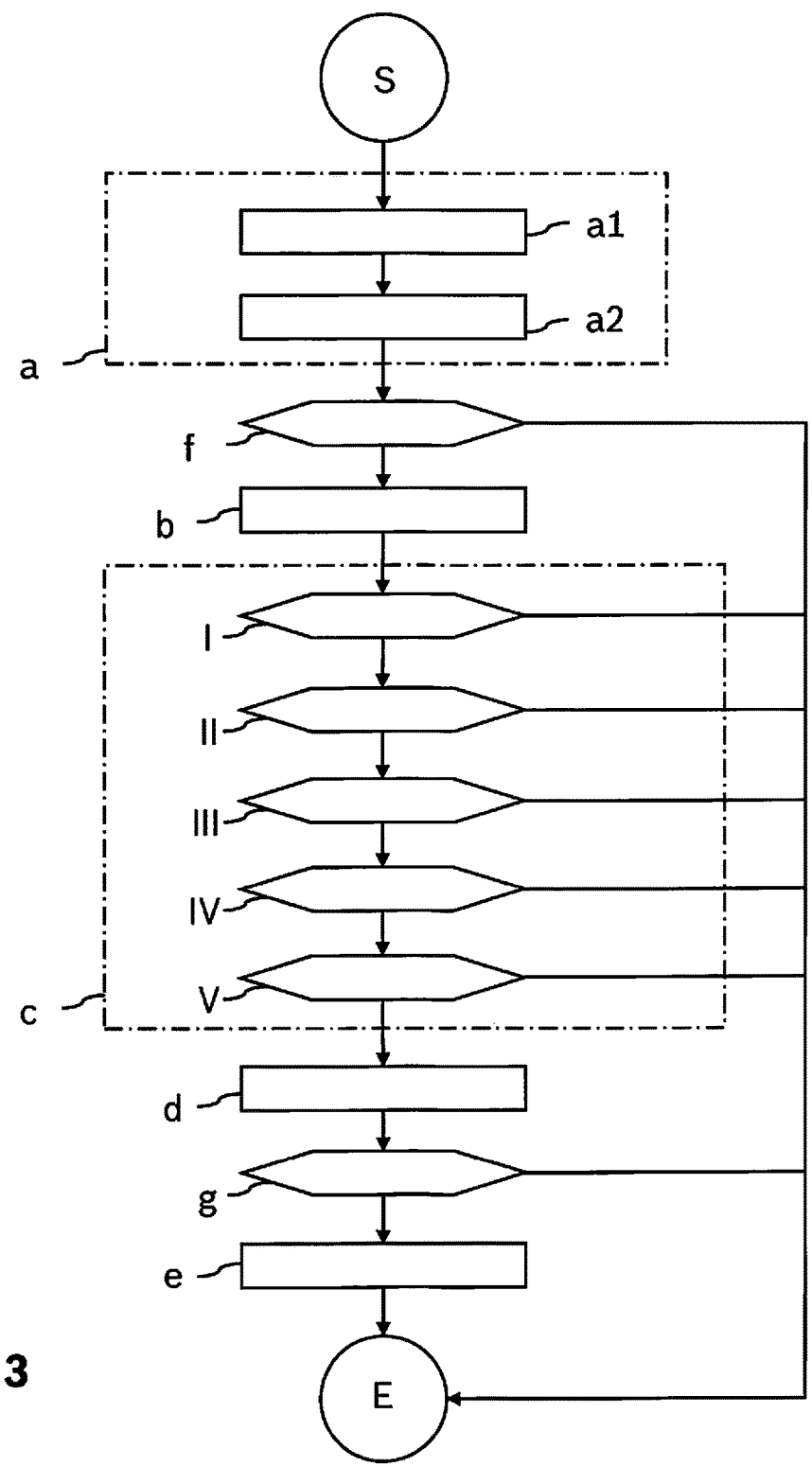
FIG. 3 shows a third exemplary embodiment of a method for ascertaining the internal resistance of an electrical energy accumulator according to the present invention.

FIG. 3 shows a third exemplary embodiment of a method for ascertaining the internal resistance of an electrical energy accumulator according to the present invention. Starting from the method according to FIG. 2, the exemplary embodiment includes a further, optional method step g. This method step g is carried out between method step d and prior to method step e. In method step g it is checked whether calculated zero-phase resistance $R_{zp}$ lies between a theoretical minimum limit value and a theoretical maximum limit value $R_{i,max}$. If this is not the case, the method is ended prematurely again. For lead batteries, for example, minimum limit value $R_{i,min}$ lies at approximately 2 mΩ and the maximum limit value $R_{i,max}$ lies at approximately 50 mΩ.

In another alternative exemplary embodiment that is not shown, the method is carried out in an identical manner to one of the exemplary embodiments shown in FIG. 1, 2 or 3. This alternative exemplary embodiment differs merely in method step d. For instance, in method step d zero-phase resistance $R_{zp}$ is calculated by dividing the root mean square of peak voltage values $U_p$ by the root mean square of peak current values $I_p$.

Figure 4:
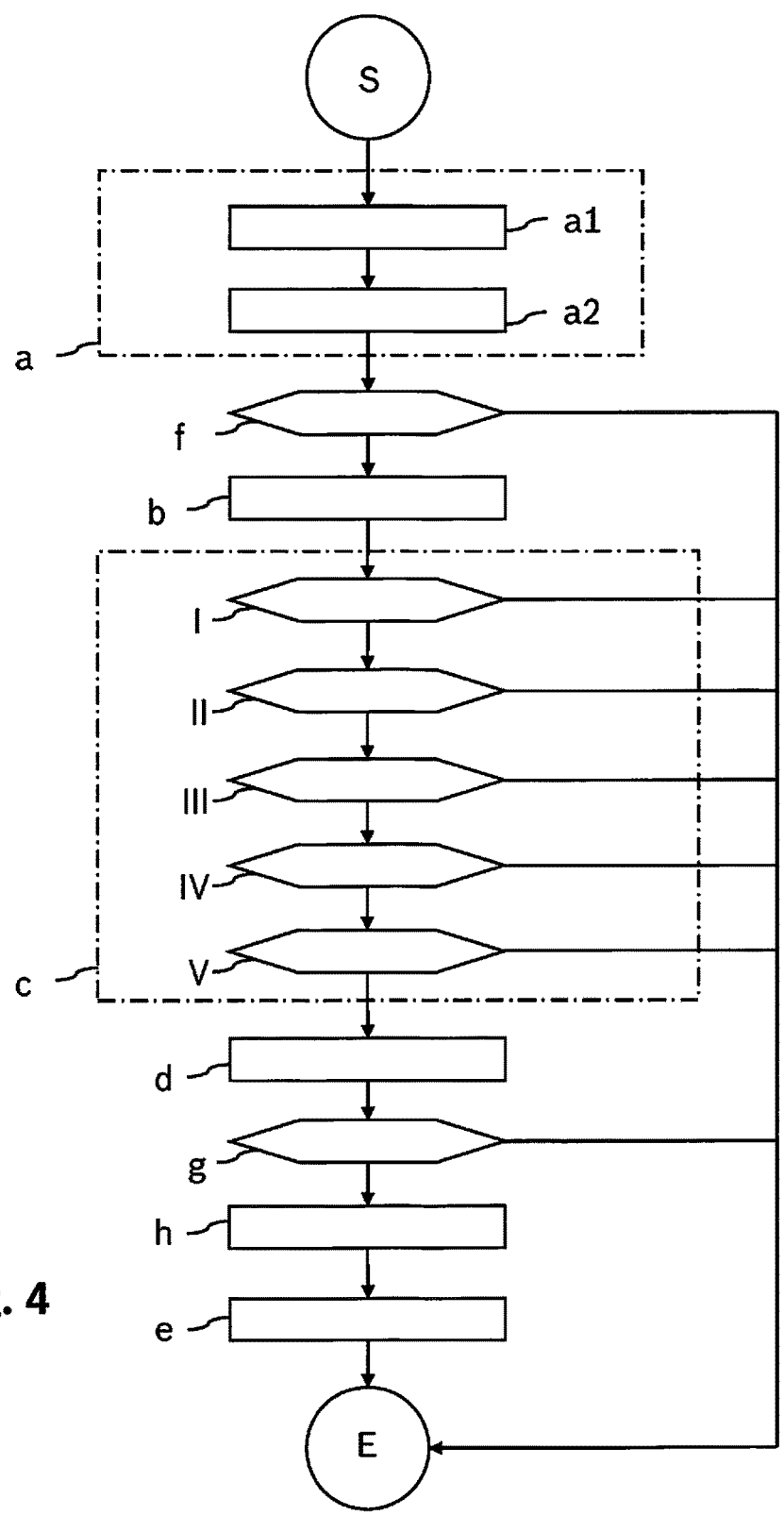
FIG. 4 shows a fourth exemplary embodiment of a method for ascertaining the internal resistance of an electrical energy accumulator according to the present invention.

FIG. 4 shows a fourth exemplary embodiment of a method for ascertaining the internal resistance of an electrical energy accumulator according to the present invention. Starting from the method according to FIG. 3, the method has a further, optional method step h. Method step h is carried out following method step d but prior to method step e. However, this is done only in the event that zero-phase resistance $R_{zp}$ was calculated in method step d by calculating a quotient from peak voltage value $U_p$ and peak current value $I_p$. In method step h, calculated zero-phase resistance $R_{zp}$ is low-pass filtered, which is accomplished with the aid of a PT1 element, for example.

In further, alternative exemplary embodiments, which are not illustrated, optional method steps f, g, and h may also be implemented independently of each other in a method. For example, starting from the method according to FIG. 1, it is possible that only method step g is carried out between method step d and method step e, whereas method steps f and h are not executed.

In the previously mentioned exemplary embodiments internal resistance $R_i$ is ascertained by calculating zero-phase resistance $R_{zp}$. However, it is also possible to determine further resistance definitions, such as a differential resistance, a 1-kHz resistance or an Ohmic resistance in an approximation on the basis of calculated zero-phase resistance $R_{zp}$. This can be attributed to the fact that the deviations between all of these resistance definitions are limited to a certain extent. Therefore, it is possible, for example, also to determine the differential resistance with a certain tolerance on the basis of calculated zero-phase resistance $R_{zp}$.

What is claimed is:

1. A method for ascertaining an internal resistance of an electrical energy accumulator, the method comprising:
   performing an analog to digital conversion of an analog voltage signal and an analog current signal of the electrical energy accumulator in order to obtain digital voltage values and digital current values;
   filtering the digital voltage values and the digital current values through a band-pass filter around a zero-phase frequency in order to obtain filtered voltage values and filtered current values,
   checking whether the following calculation prerequisites are satisfied:
      a first calculation prerequisite in which the band-pass filter is initialized,
      a second calculation prerequisite in which a peak current value together with an associated instant of the peak current value is ascertained from the filtered current values;
      a third calculation prerequisite in which an amount of the peak current value is greater than an amount of a threshold current value, the amount of the threshold current value being greater than an amount of a minimum threshold current value by which a zero-phase resistance with a predefined maximum deviation from an actual internal resistance is able to be calculated;
      a fourth calculation prerequisite in which the filtered voltage value at the previously ascertained instant is a peak voltage value; and
      a fifth calculation prerequisite in which the peak current value and the peak voltage value have the same algebraic sign;
   checking the calculation prerequisites on an one after the other basis, wherein the first calculation prerequisite is additionally able to be checked at any other arbitrary point during the checking step;
   ending the method if one of the calculation prerequisites is not satisfied;

calculating the zero-phase resistance from the peak voltage value and the peak current value if the method was not yet ended previously; and providing the zero-phase resistance as an internal resistance of the electrical energy accumulator to be determined if the method was not yet ended previously.

2. The method as recited in claim 1, further comprising:

checking a validity of the digital voltage values and the digital current values, the digital voltage values and the digital current values being considered valid if the performing of the analog to digital conversion was carried out successfully, and ending the method in case of an invalid digital voltage value or an invalid digital current value, wherein the step of checking the validity is carried out after the step of performing the analog to digital conversion and prior to method step a and prior to the step of providing the zero-phase resistance.

3. The method as recited in claim 1, wherein at least one of the peak current value and the peak voltage value is ascertained with the aid of an 3-element FIFO principle.

4. The method as recited in claim 1, further comprising:

checking a plausibility of the calculated zero-phase resistance, wherein the calculated zero-phase resistance is checked to be plausible if the calculated zero-phase resistance lies between a theoretical minimum limit value and a theoretical maximum limit value; and ending the method in case of an implausible zero-phase resistance, wherein the step of checking the plausibility is carried out between the step of calculating the zero-phase resistance and the step of providing the zero-phase resistance.

5. The method as recited in claim 1, wherein the calculation of the zero-phase resistance includes calculating a quotient from the peak voltage value and the peak current value.

6. The method as recited in claim 5, further comprising:

performing a low-pass filtering of the calculated zero-phase resistance with the aid of a PT1 element, wherein the low-pass filtering is carried out between the step of calculating the zero-phase resistance and the step of providing the zero-phase resistance.

7. The method as recited in claim 1, wherein the calculation of the zero-phase resistance includes calculating a quotient from a root mean square of the voltage peak values and a root mean square of the peak current values.

* * * * *